United States Patent
Nakagawa

(10) Patent No.: US 7,702,197 B2
(45) Date of Patent: Apr. 20, 2010

(54) SOA ARRAY OPTICAL MODULE

(75) Inventor: Goji Nakagawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/040,193

(22) Filed: Feb. 29, 2008

(65) Prior Publication Data

US 2008/0226229 A1     Sep. 18, 2008

(30) Foreign Application Priority Data

Mar. 16, 2007  (JP)  ............... 2007-069579

(51) Int. Cl.
G02B 6/32  (2006.01)

(52) U.S. Cl. ............... 385/33; 385/31; 385/88; 385/93

(58) Field of Classification Search ............ 385/33, 385/31, 88–94
See application file for complete search history.

(56) References Cited

U.S. PATENT DOCUMENTS

| | | | |
|---|---|---|---|
| 6,363,603 B1 | 4/2002 | Nemoto et al. | |
| 6,597,836 B2 * | 7/2003 | Johnson et al. | 385/33 |
| 6,747,793 B1 * | 6/2004 | Flanders | 359/344 |
| 7,300,216 B2 * | 11/2007 | Morse et al. | 385/92 |
| 7,367,716 B2 * | 5/2008 | Nagano et al. | 385/89 |
| 2003/0152325 A1 | 8/2003 | Yasuda et al. | |
| 2008/0050067 A1 * | 2/2008 | Nakagawa | 385/33 |
| 2008/0101747 A1 * | 5/2008 | Nakagawa | 385/17 |

FOREIGN PATENT DOCUMENTS

| | | |
|---|---|---|
| JP | 03-168606 | 7/1991 |
| JP | 3-168606 | 7/1991 |
| JP | 11-245266 | 9/1999 |
| JP | 2000-236138 | 8/2000 |
| JP | 2001-030306 | 2/2001 |
| JP | 2001-30306 | 2/2001 |
| JP | 2002-243987 | 8/2002 |
| JP | 2003-149614 | 5/2003 |
| JP | 2003-241005 | 8/2003 |
| JP | 2007-033853 | 2/2007 |
| JP | 2007033853 A * | 2/2007 |

OTHER PUBLICATIONS

Japanese Office Action issued on Jan. 6, 2009 in corresponding Japanese Patent Application No. 2007-069579.
Japanese Patent Office Notice of Reasons for Rejection, mailed Mar. 31, 2009 and issued in corresponding Japanese Patent Application 2007-069579.

* cited by examiner

*Primary Examiner*—Ellen Kim

(57) ABSTRACT

In an SOA array optical module, the central axis of a beam output from each intra-SOA waveguide is oblique by 22.3 degrees to a normal to an end face of an SOA array on the output side (the same applies to the input side) of the SOA array having intra-SOA waveguides of 8 channels. First and second lens arrays are arranged for the SOA array so that the central axis of the beam that is output obliquely by 22.3 degrees from the SOA array, the optical axis of a lens convex part of each channel of the first lens array, and the optical axis of a lens convex part of each channel of the second lens array agree with one another. Level differences are provided respectively on faces opposite to the lens convex parts of the first and the second lens arrays.

7 Claims, 10 Drawing Sheets

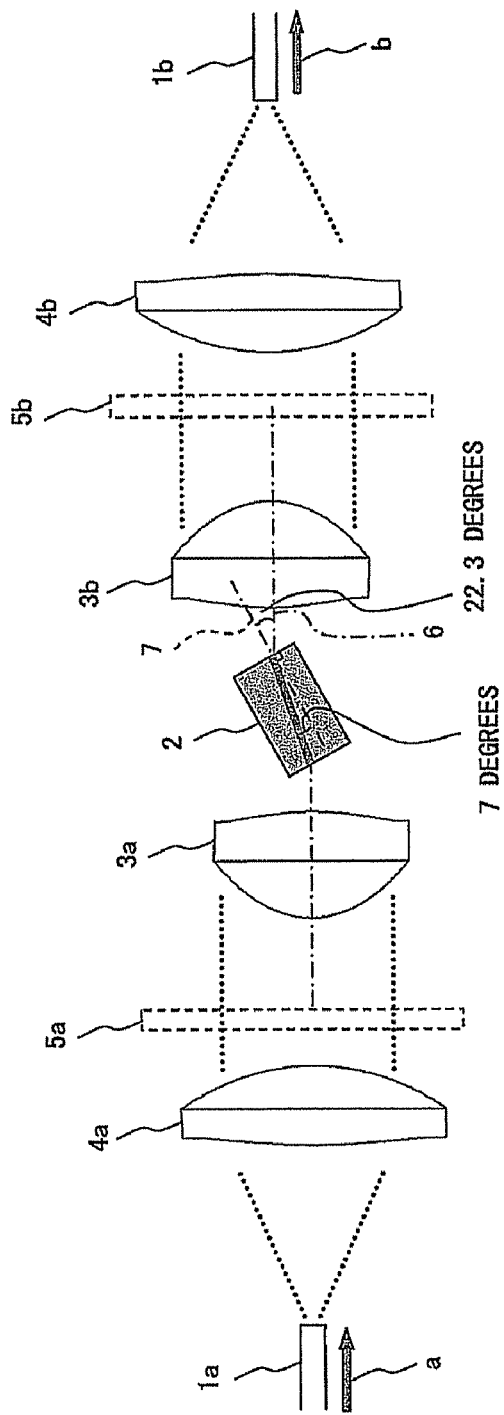
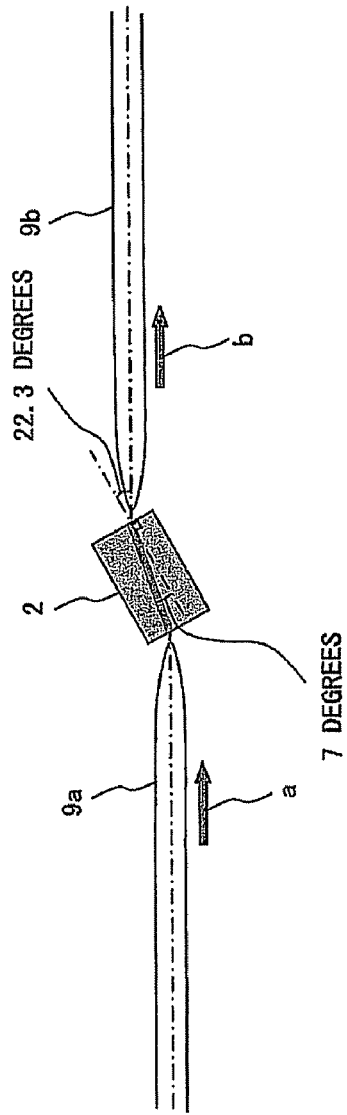
FIG. 1A
FIG. 1B

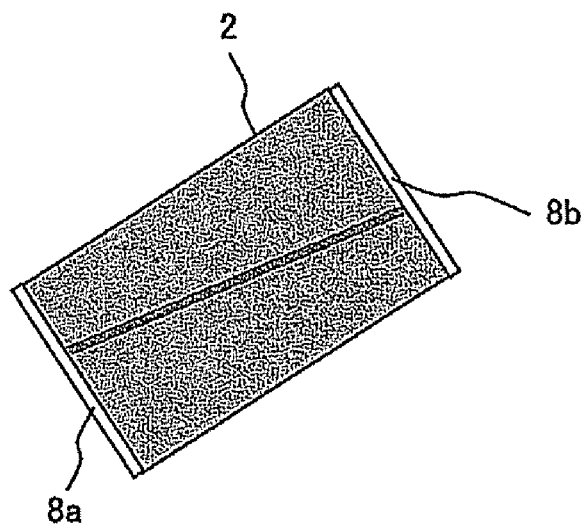
F I G. 3

| | SECOND PREFERRED EMBODIMENT AND ITS MODIFICATION EXAMPLE (LENS ARRAYS) | PROTOTYPE EXAMPLE (LENS ARRAYS) | CONVENTIONAL TECHNIQUE 1 (SINGLE-CHANNEL LENSES) | CONVENTIONAL TECHNIQUE 2 (SPHERICAL LENSED FIBERS) |
|---|---|---|---|---|
| CONFIGURATION | INPUTTING LIGHT VERTICALLY TO CONVEX PART OF LENS | INPUTTING LIGHT OBLIQUELY TO CONVEX PART OF LENS | COUPLING SINGLE-CHANNEL SOA TO SINGLE-CHANNEL FIBER BY USING SINGLE LENSES AS FIRST AND SECOND LENSES | FORMING LENS AT TIP OF FIBER |
| COUPLING LOSS | ○ 3dB | × 6dB | ○ 3dB | △ 3dB (VARIATIONS IN CHANNELS) |
| DEGREE OF EASINESS OF HERMETIC SEALING OF MODULE | NORMAL SEALING METHOD | NORMAL SEALING METHOD | NORMAL SEALING METHOD | × DIFFICULTY IN SEALING BETWEEN FIBER AND PACKAGE |

FIG. 9

SOA ARRAY OPTICAL MODULE

BACKGROUND OF THE INVENTION

1. Field of the Invention

The present invention relates to an SOA (Semiconductor Optical Amplifier) array optical module, and more particularly, to an SOA array optical module using a lens array for controlling a plurality of optical signals by arranging a plurality of optical gates in each of which a lens array is provided between an SOA array and an optical fiber array.

2. Description of the Related Art

In recent years, the distance and the capacity of an optical communications network have been increasing with a growing demand for a communication made by a broadband service.

For example, high-speed and large-capacity WDM (Wavelength Division Multiplexing for simultaneously transmitting a plurality of signals with a single optical fiber by multiplexing light beams of different wavelengths) is currently under development.

In the meantime, a higher-speed, larger-capacity and flexible optical communications network has been demanded with the rapid popularization of the Internet, and an increase in the volume of data traffic.

An optical packet switching technique draws attention as a technique for building such an optical communications network.

The optical packet switching is a technique for making packet switching by using communication information totally unchanged as light. This technique eliminates restrictions on an electronic processing speed in comparison with conventional switching for once converting an optical signal into an electric signal. Therefore, the processing speed depends on only the propagation delay time of light, and accordingly, a high-speed and large-capacity transmission can be made.

If an optical signal is switched in units of packets, gate switches are used to turn on/off the optical signal. The gate switches for turning on/off an optical signal with an electric control include an electro-absorption gate switch and a semiconductor optical amplifier gate switch.

The electro-absorption gate switch is intended to change optical absorption by using electro-absorption effect. However, this gate has a disadvantage of a large loss even in a transmission state.

In contrast, the semiconductor optical amplifier gate switch is intended to change a gain with a driving current applied to a semiconductor amplifier, and has not only a function as an optical gate for turning on/off light but also an amplification function (to amplify and output light when a gate is turned on). Accordingly, this gate switch currently attracts attention as an optical element that reduces a loss of an optical signal and makes high-speed switching.

For an SOA, its extinction ratio of ON (open) to OFF (closed) of a gate is high, and its amplification mechanism can reduce an optical loss. Since the SOA is an optical element formed with a semiconductor, it has an advantage of downsizing enabled at low cost with a semiconductor integration technique.

The extinction ratio is a ratio of the average light intensity of signals "1" and "0" when a gate is ON to that of signals "1" and "0" when the gate is OFF. As the extinction ratio becomes higher, ON/OFF of a gate can be more explicitly identified. As a result, signal crosstalk that affects another port can be reduced, and a bit error rate becomes low.

FIGS. 1A and 1B schematically show two examples of optically coupled configurations of a conventional single-channel SOA module. Dotted-dashed lines shown in FIGS. 1A and 1B depict the propagation paths of an optical signal.

In the single-channel SOA module using a single lens shown in FIG. 1A, an SOA 2 is arranged between a single-channel optical fiber 1a arranged on an input side indicated by an arrow a, and a single-channel optical fiber 1b arranged on an output side indicated by an arrow b.

Additionally, a second lens 4a and a first lens 3a are arranged between the single-channel optical fiber 1a and the SOA 2 on the input side, whereas a first lens 3b and a second lens 4b are arranged between the SOA 2 and the single-channel optical fiber 1b on the output side.

Furthermore, hermetic windows 5a, 5b for hermetically sealing a semiconductor element (SOA) are arranged respectively between the second lens 4a and the first lens 3a, and between the first lens 3b and the second lens 4b.

As shown in FIG. 1A, output light 6 of the SOA 2 is inclined by 22.3 degrees with respect to an axis 7 of the SOA 2. Therefore, optical coupling is made by arranging the first lens 3b and the second lens 4b so that their surfaces become vertical to the inclined output light of the SOA 2. This applies also to the input side.

The optical coupling system shown in FIG. 1A is a technique normally used to optically couple an optical module such as an LD (Laser Diode: semiconductor laser) that outputs a light beam vertically to an end face of an element.

For a gate switch using an SOA, an unnecessary oscillation made by return light must be prevented by reducing reflection on the light output end face of the SOA to 50 dB or less in order to prevent an oscillation caused by the internal reflection of the SOA.

To implement this, the end faces of the chip of the SOA 2 are initially inclined as described above so that a line vertical to the end face on the light output side of the SOA 2 and an optical waveguide within the SOA form, for example, an angle of 7 degrees.

Then, a return loss (reflected return light) is suppressed by outputting an optical signal to the first lens 3b as indicated by the dotted-dashed line, for example, at an angle of 22.3 degrees with respect to the vertical line (broken line) of the end face of the chip based on a relationship between the refractive index of the optical waveguide within the chip and that of space.

FIG. 2A shows the inclination of output light with respect to the axis when the end faces of the chip of the SOA are inclined, whereas FIG. 2B shows a relationship between the inclination (output angle) and the return loss ratio of the output light. In FIG. 2B, its horizontal axis represents the output angle θ (degrees), and its vertical axis represents the return loss ratio (dB).

According to the relationship between the inclination angle θ and the return loss ratio dB of the output light, which is shown in FIG. 2B, efficiency is normally regarded as being high on the whole by reducing the return loss ratio by −20 to −30 dB.

However, it is insufficient that reductions in the reflection on the light output end face by using the inclination angle θ is on the order of −20 to −30 dB. Therefore, the end faces of the chip are AR (Anti Reflection)-coated.

FIG. 3 shows a state where AR coated multilayer films are formed on the end faces of the chip of the SOA. As shown in FIG. 3, AR-coated multilayer films 8a and 8b are formed on both end faces of the chip of the SOA 2. In this way, the magnitude of a return loss is reduced at present by setting the light output angle of the SOA 2 and by forming AR coated layers.

Additionally, in a single-channel SOA module using spherical lensed fibers shown in FIG. 1B, the SOA 2 is arranged between the single-channel spherical lensed fibers 9a and 9b, which are arranged on input and output sides respectively indicated by arrows a and b.

The tips of the spherical lensed fibers 9a and 9b are formed as a sphere and have the action of a lens. Therefore, the first lenses 3a, 3b and the second lenses 4a, 4b, which are shown in FIG. 1A, can be omitted.

Since this configuration easily enables optical coupling for obliquely output light, it is used for an experiment of a research, etc. in many cases. However, this configuration has difficulty in hermetically sealing the SOA. Therefore, it is rarely used as a practical module.

If the SOA is hermetically sealed with the configuration shown in FIG. 1B, a hermetically sealing part cannot be provided between the SOA 2 and the spherical lensed fibers 9a, 9b. Therefore, the SOA 2 and the tips of the spherical lensed fibers 8a and 8b are to be hermetically sealed altogether.

As a result, reliability cannot be ensured due to a displacement, etc., which occurs between the SOA 2 and the spherical lensed fibers 9a, 9b with the thermal expansion and contraction of a hermetically sealed body based on a change in an ambient temperature. This is the reason why this single-channel SOA module using spherical lensed fibers is used only in laboratories and not put into practice use.

In the meantime, reductions in the size, the consumed power and the cost of a module or a device by collectively forming a plurality of channels, namely, by arraying a plurality of channels have been demanded for an optical gate switch.

In this case, the pitch of a semiconductor element array such as an LD array, an SOA array, etc., and that of an optical fiber array are an issue when optically coupling these arrays.

Known as an optically coupled and arrayed structure using spherical lensed fibers is a configuration where a semiconductor optical amplifier (SOA) and an external resonator using a fiber grating are combined, the tip of the fiber grating is made spherical, and the tip and the light output side of the semiconductor optical amplifier, on which a low reflection film is formed, are optically coupled and arrayed (for example, see Patent Document 1). However, Patent Document 1 does not disclose hermetical sealing.

Also known is a configuration where silica-based lightwave circuit substrate on which an SOA array as gate switches is implemented as a hybrid integrated circuit, and a silica-based lightwave circuit substrate on which an arrayed waveguide grating is formed are coupled to make optical signal switching such as optical cross-connect, etc. (for example, see Patent Document 2).

The above described Patent Documents 1 and 2, however, do not adopt a lens array. Normally, the diameter of an optical fiber in an optical fiber array is 125 µm, and many optical fiber arrays of 250-µm pitch are commercially available.

Also a semiconductor element array of 250-µm pitch is normally chosen, because the number of elements obtained per unit area of a substrate is desired to increase.

The pitch of an optical fiber array and that of a semiconductor element array are the same as described above. Therefore, if only a lens array of the same pitch as those of the arrays exists, it seemed to be possible to easily implement a configuration where optical gate switches of a plurality of channels are collectively formed by optically coupling a semiconductor element array and an optical fiber array via a lens array.

However, the diameters of the lenses (the first lenses 3a, 3b and the second lenses 4a, 4b) used for the optical coupling shown in FIG. 1A are approximately 1 to 2 mm in normal cases. Therefore, a lens array of 250-µm pitch cannot be formed by arranging lenses of this size.

Accordingly, an array implemented by forming many convex parts on a transparent substrate is normally adopted as a lens array used to optically couple a semiconductor element array and an optical fiber array.

FIG. 4 schematically shows an example of a well-known optically coupled configuration implemented by arranging a lens array between a semiconductor element array composed of an LD and an optical fiber array. Here, the LD is a light source.

The optically coupled configuration shown in FIG. 4 represents an example using the lens array 13 of 250-µm pitch for the optical coupling of the LD array 11 of 250-µm pitch and the optical fiber array 12 of 250-µm pitch.

In this example, the lens array 13 represents a micro-lens array implemented by forming convex lenses 15 of 250-µm pitch on the surface of a substrate 14 having a thickness of 500 µm.

The lens array 13 is arranged in parallel to the end face of the output side of the LD array 11 by orientating the surface, on which the convex lenses 15 are formed, to the LD array 11.

The optical fiber array 12 is arranged so that its input face, which is formed vertically to the axis of an optical fiber 18, becomes parallel to the rear face of the lens array 13.

An optical signal 17, which is output from a light waveguide 16 of each element of the LD array 11 along an optical axis 19 vertical to the end face on the output side of the LD array 11, is incident to the convex lens 15 of the lens array 13 along the optical axis of the convex lens 15, converged while passing through the lens array 13, and incident to each optical fiber 18 of the optical fiber array 12 along the optical axis of the optical fiber 18 after passing through the rear face of the lens array 13.

Namely, the optical axis of each of the elements through which an optical signal passes is formed by the linear optical axis 19 in the optically coupled configuration using the LD array 11.

The above described configuration where an optical signal from a light source is input to an optical fiber array via a lens array by using an LD array as the light source conventionally exists. However, a lens array has never been adopted in an optically coupled configuration of a gate switch for relaying and turning on/off an optical signal.

The arrayed gate switches are disclosed by the above described Patent Documents 1 and 2. However, neither of these techniques adopts a lens array.

Gate switches for turning on/off an optical signal mainly include an electro-absorption gate switch and a semiconductor optical amplifier gate switch. However, the electro-absorption gate switch has a disadvantage that a loss is large even in a transmission state as described above.

[Patent Document 1] Japanese Published Unexamined Patent Application No. 2000-236138

[Patent Document 2] Japanese Published Unexamined Patent Application No. 2003-149614

SUMMARY OF THE INVENTION

An SOA (Semiconductor Optical Amplifier) array optical module according to the present invention is an SOA array optical module for optically coupling an SOA array and an optical fiber array by using a lens array, and configured so that a lens optical axis of each channel of the lens array agrees with the central axis of an output beam of each channel of the SOA array.

The lens array is configured, for example, by providing a level difference on a rear side so that the level difference becomes almost vertical to the central axis of the output beam of each channel of the SOA array.

In this SOA array optical module, for example, the lens optical axis of each channel of the lens array may be arranged to agree with or become parallel to the central axis of the output beam of each channel of the SOA array.

In this case, the lens array is separated, for example, into first and second lens arrays, the first lens array and the second lens array are arranged respectively on the side of the SOA array and the side of the optical fiber array between the SOA array and the optical fiber array, the lens optical axis of each channel of the first lens array is arranged to agree with the central axis of the output beam of each channel of the SOA array, and the lens optical axis of each channel of the second lens array is arranged to become parallel to the central axis of the output beam of each channel of the SOA array.

For example, the rear faces of the first and the second lens arrays are formed to be planar so that the rear faces and the central axis of the output beam of each channel of the SOA array form the same angle.

Additionally, the lens array may be formed, for example, by press-molding low-melting glass, or by press-molding plastic.

According to the present invention, the lens optical axis of each channel of the lens array is arranged to agree with the central axis of the output beam of each channel of the SOA array, whereby an SOA array optical module, which does not cause a coupling loss due to the aberration of a lens even if a lens array is used, can be provided.

Additionally, low-melting glass or plastic is used as a lens array. Therefore, the lens array can be mass-produced with press-molding even if it has a fine shape, leading to reductions in cost.

BRIEF DESCRIPTION OF THE DRAWINGS

FIGS. 1A and 1B schematically show two examples of optically coupled configurations of a conventional single-channel SOA module;

FIG. 3 shows a state where multilayer films for preventing reflection are formed on the end faces of the chip of the conventional SOA;

FIG. 9 shows a table that represents the evaluations of a coupling loss of the SOA array optical modules according to the present invention.

DESCRIPTION OF THE PREFERRED EMBODIMENTS

Preferred embodiments according to the present invention are described below with reference to the drawings.

First Preferred Embodiment

Figure 2A:
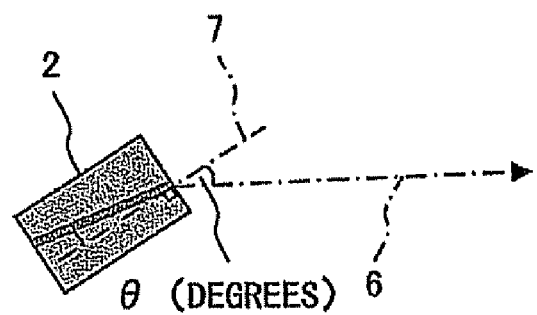
FIG. 2A shows the inclination of output light with respect to an axis when the end faces of a chip of a conventional SOA are made oblique.
Figure 2B:
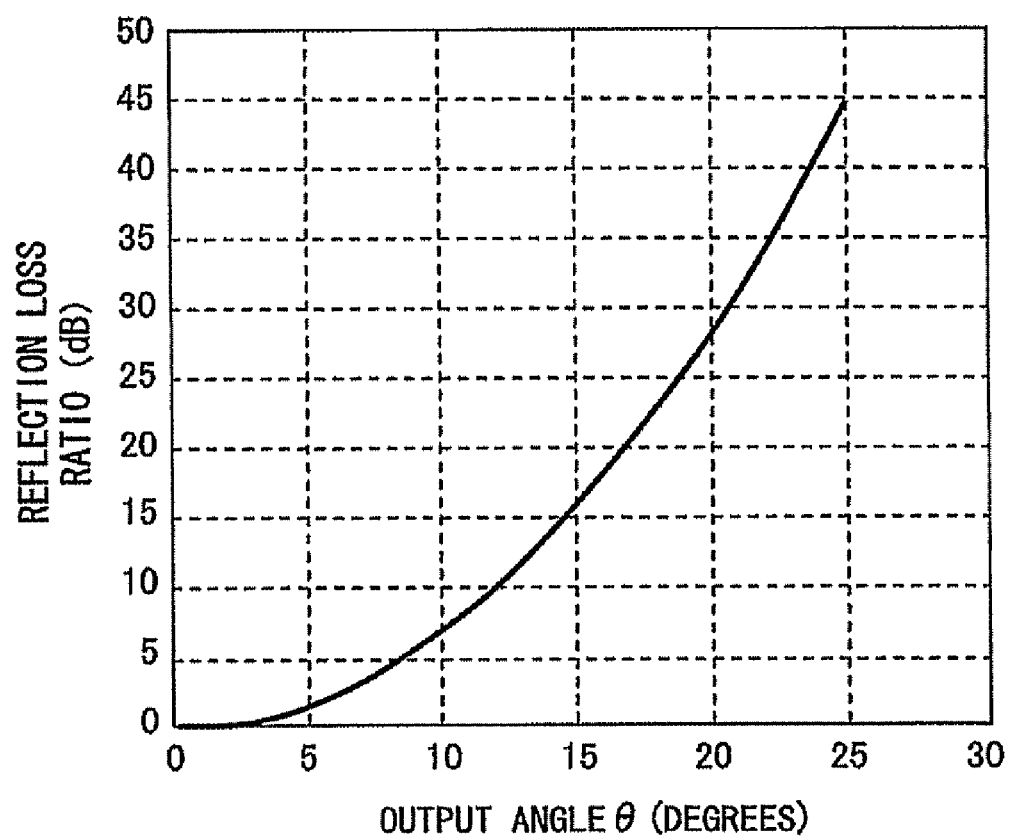
FIG. 2B shows a relationship between the inclination (output angle) and the return loss ratio of the output light.
Figure 4:
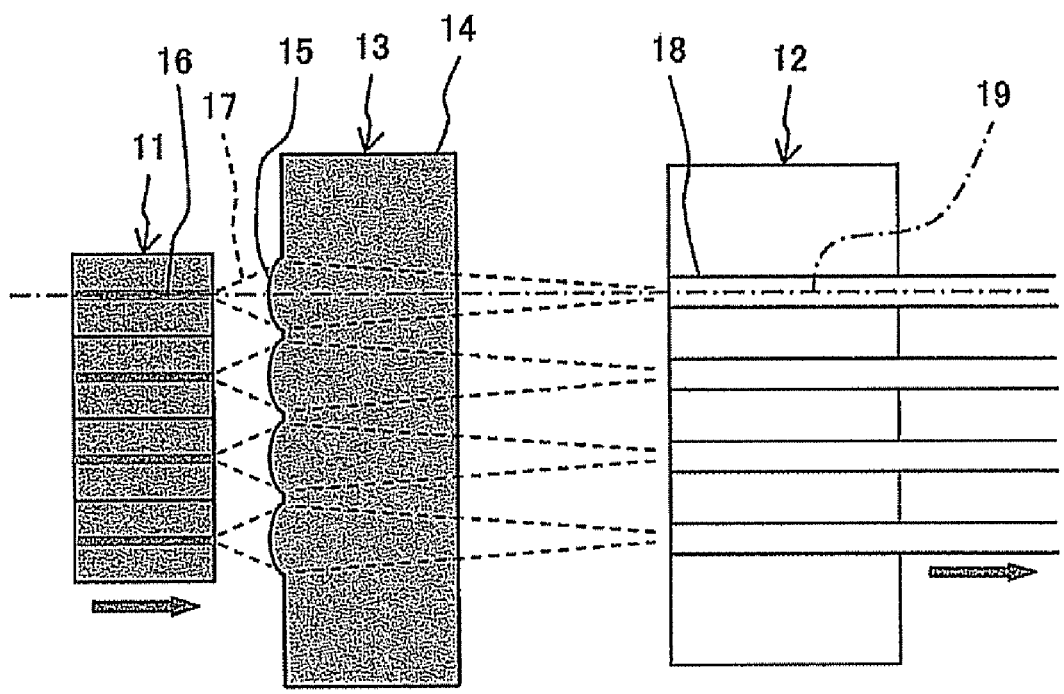
FIG. 4 schematically shows an example of an optically coupled configuration implemented by arranging a lens array between a conventional semiconductor element array and an optical fiber array.
Figure 5:
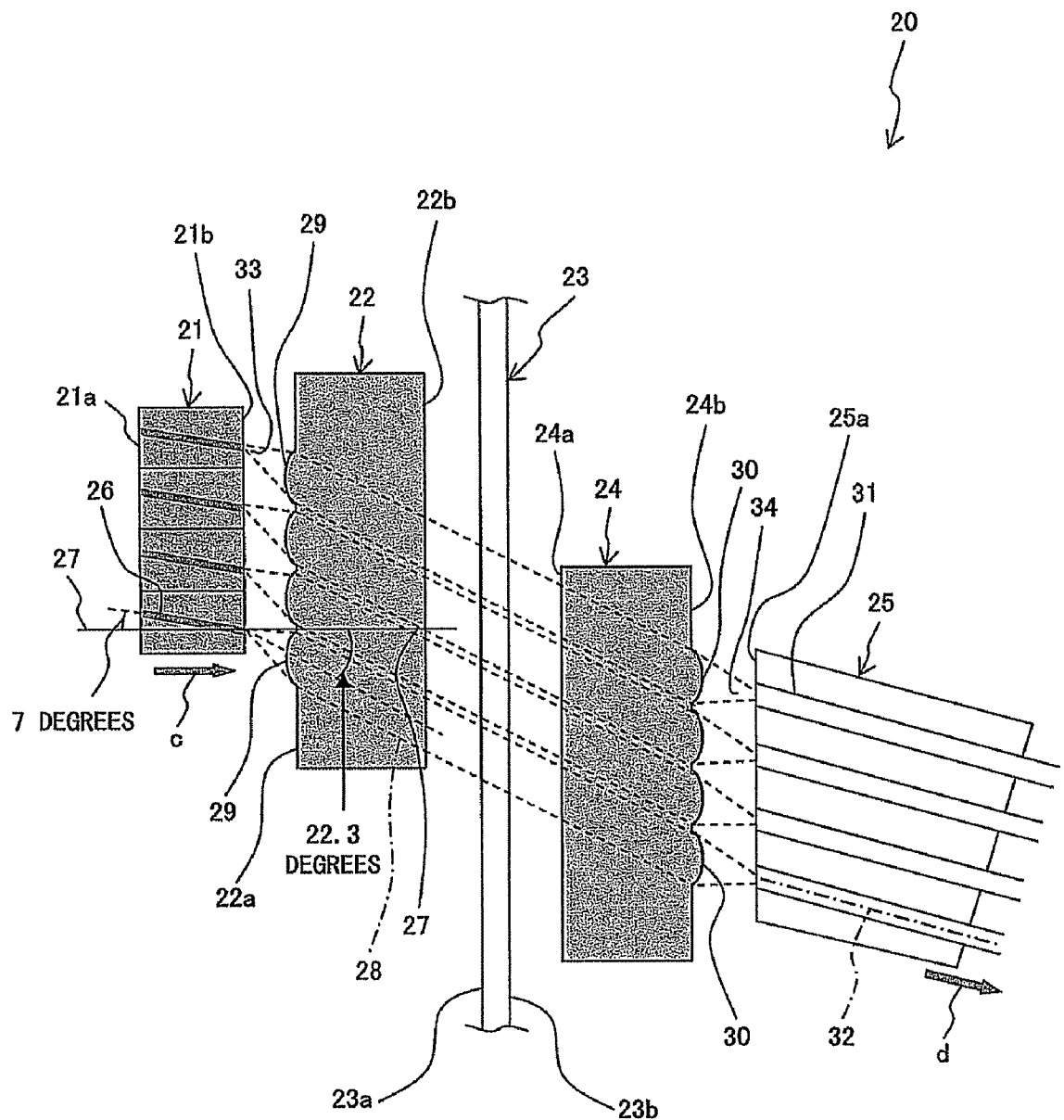
FIG. 5 schematically shows a configuration of a principal portion of an SOA array optical module using lens arrays prototyped as a first preferred embodiment.

FIG. 5 schematically shows a configuration of a principal portion of an SOA array optical module using lens arrays prototyped as a first preferred embodiment.

As shown in FIG. 5, the principal portion of the SOA array optical module 20 is composed of an SOA array 21, a first lens array 22, a hermetic window 23, a second lens array 24, and an optical fiber array 25.

FIG. 5 shows only the optical signal output side of the SOA array optical module 20. A first lens array, a hermetic window, a second lens array, and an optical fiber array on an optical signal input side are arranged symmetrically with respect to the central point of the SOA array 21, and the principle of optical coupling on the optical signal input side is the same as that on the optical signal output side except for the proceeding direction of an optical signal. Therefore, the constituent elements on the input side are not shown.

As shown in FIG. 5, an optical signal input side end face 21a and an optical signal output side end face 21b of the SOA array 21, an optical signal input side end face 22a and an optical signal output side end face 22b of the first lens array 22, an optical signal input side end face 23a and an optical signal output side end face 23b of the hermetic window 23, an optical signal input side end face 24a and an optical signal output side end face 24b of the second lens array 24, and an optical signal input side end face 25a of the optical fiber array 25 are arranged in parallel.

Intra-SOA waveguides 26, which respectively configure channels of the SOA array 21, are formed to be inclined by 7 degrees with respect to a normal 27 to the end face of the SOA array 21. Therefore, an optical axis 28 of a beam output from each intra-SOA waveguide 26 is inclined by 22.3 degrees with respect to the normal 27 to the end face of the SOA array 21.

Accordingly, the beam output from each intra-SOA waveguide is obliquely incident to each lens convex part 29 that configures each channel of the lens array 22.

Also output light from each lens convex part 30, which configures each channel of the second lens array 24 that is arranged symmetrically to the first lens array 22 with respect to the hermetic window 23, is obliquely output from each lens convex part 30, and obliquely incident to each optical fiber 31 that configures each channel of the optical fiber array 25.

The optical signal input side end face 25a of the optical fiber array 25 is formed by being obliquely cut at a predetermined angle. Namely, the section of a light incident face of each optical fiber 31 of the optical fiber array 25 is formed to be oblique at a predetermined angle with respect to incident light. Accordingly, the section of the light incident face of the optical fiber 31 is slightly elliptical when viewed from the front.

The section of the light incident face of each optical fiber 31 is formed to be oblique at the predetermined angle, whereby an optical signal, which is output from each lens convex part 30 of the second lens array 24 and incident obliquely to each optical fiber 31, is incident to an optical fiber 31 along a waveguide axis 32 of the optical fiber 31 by being refracted at an interface.

Here, a simulation in this optical coupling system of this configuration was made to examine the order of magnitude of a coupling loss between a beam spot 33 output from the intra-SOA waveguide 26 of the SOA array 21 and a beam spot 34 incident to the optical fiber 31 of the optical fiber array 25.

Figure 6A:
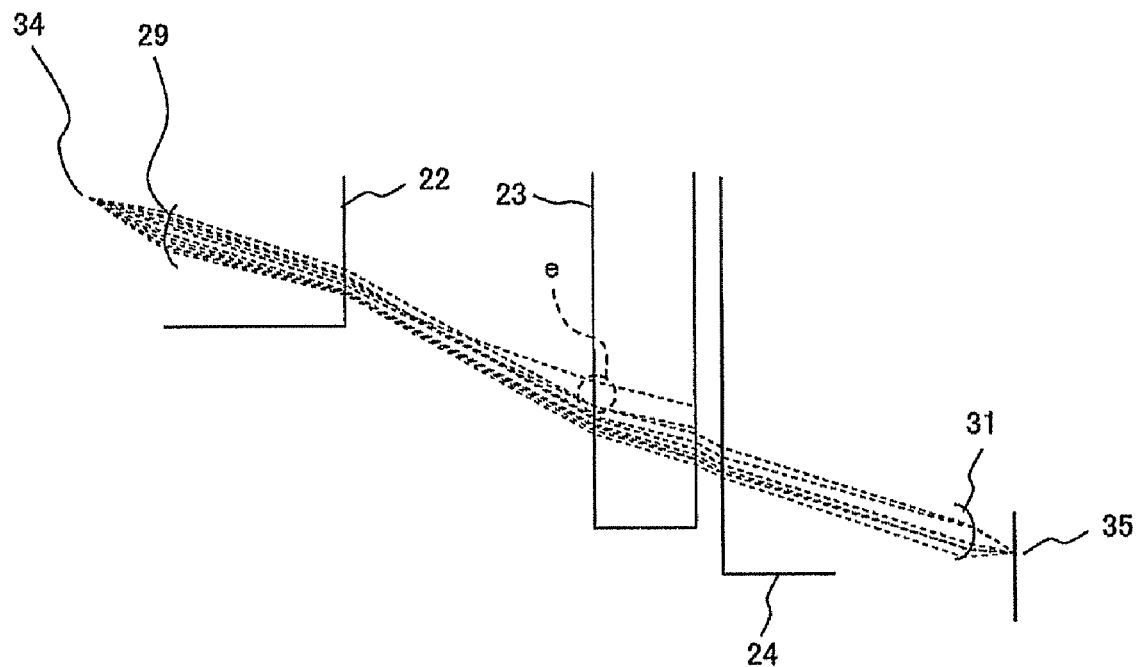
FIGS. 6A and 6B show examples of simulation results of a coupling loss in an optical coupling system indicated in the first preferred embodiment.
Figure 6B:
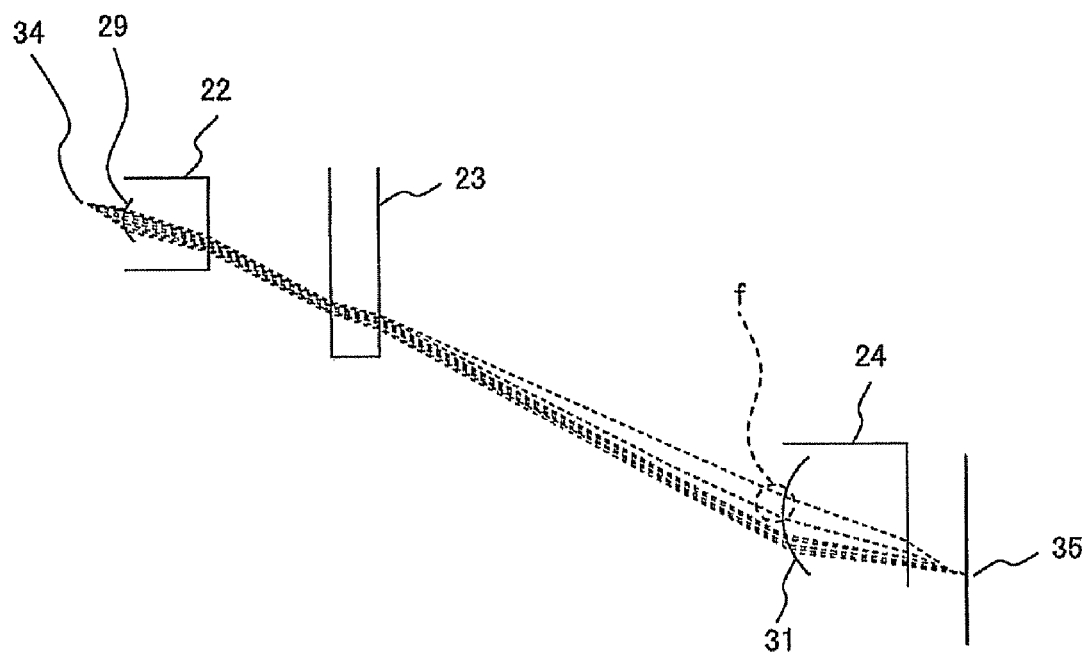

FIGS. 6A and 6B exemplify results of the simulation of the coupling loss in the optical coupling system shown in FIG. 5. In FIG. 6A, the same constituent elements as those shown in FIG. 5 are denoted with the same reference numerals. FIG. 6B shows the results of the simulation when the light incident face and the light output face of the second lens array 24 shown in FIG. 6A are replaced.

In the optical coupling system of the SOA array optical module in this prototype example, light is made incident obliquely to each lens. Therefore, the coupling loss caused by light diffusion is proved to increase as indicated by broken circles e and f of FIGS. 6A and 6B due to the influence of aberration of each lens.

The optical coupling system for making light incident obliquely to each lens in this way is proved to be a configuration that has difficulty in removing the influence of aberration and causes a large coupling loss.

Second Preferred Embodiment

Therefore, to reduce the coupling loss, the present inventor devised a configuration where the optical axis of the lens convex part of each channel of the lens array agrees with the central axis of the output beam of each channel of the SOA array. This configuration is described below as the second preferred embodiment.

Figure 7:
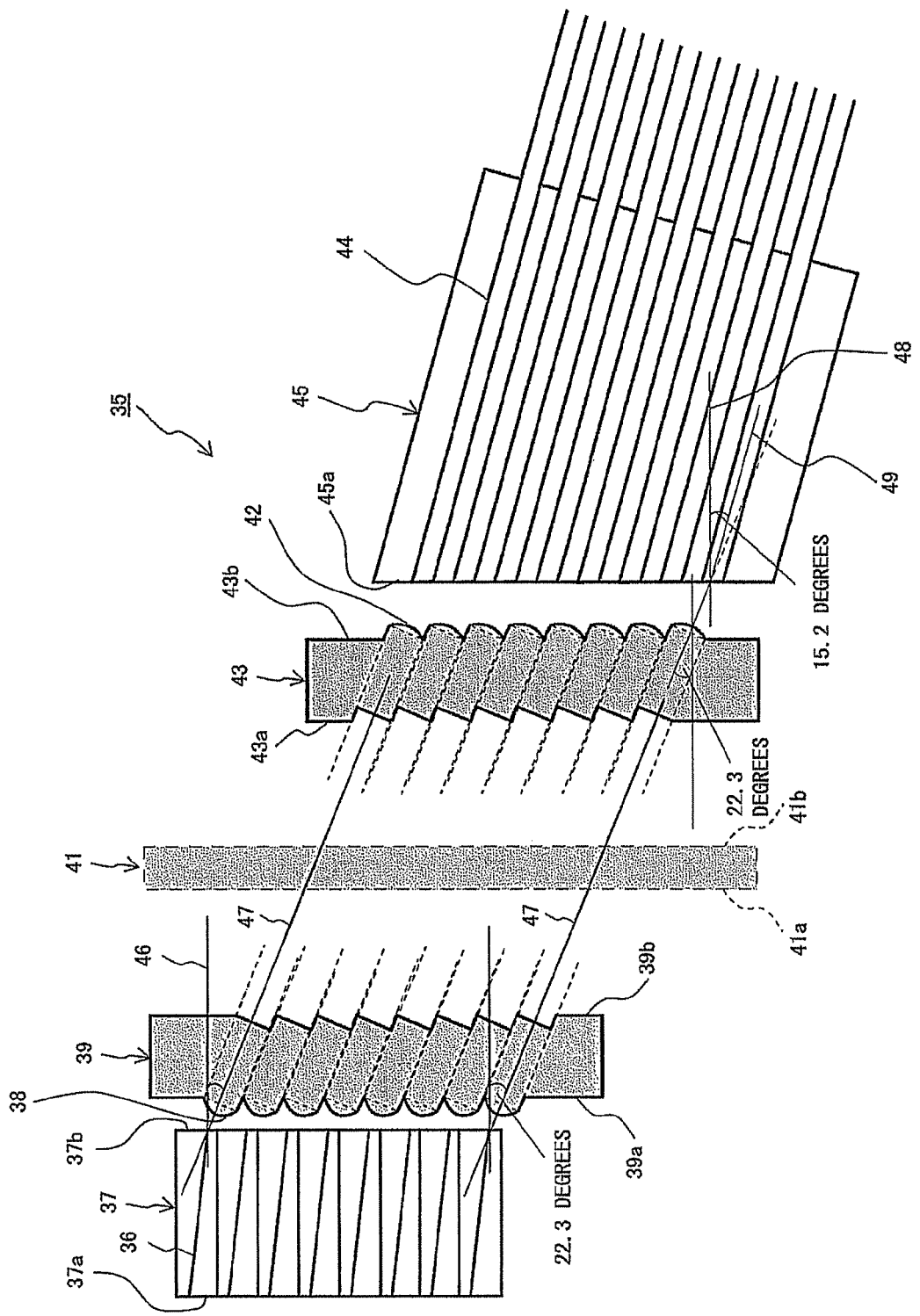
FIG. 7 schematically shows a configuration of a principal portion of an SOA array optical module using lens arrays in a second preferred embodiment.

FIG. 7 schematically shows a configuration of a principal portion of an SOA array optical module using lens arrays according to the second preferred embodiment.

This SOA array optical module 35 comprises an SOA array 37 having intra-SOA waveguides 36 of 8 channels, a first lens array 39 having lens convex parts 38 of 8 channels, a hermetic window 41 for collectively transmitting optical signals of 8 channels, a second lens array 43 having lens convex parts 42 of 8 channels, and an optical fiber array 45 having optical fibers 44 of 8 channels.

FIG. 7 shows only the optical signal output side of the SOA array optical module 35. A first lens array, a hermetic window, a second lens array, and an optical fiber array on an optical signal input side are arranged symmetrically with respect to the central point of the SOA array 37, and the principle of optical coupling on the optical signal input side is the same as that on the optical signal output side except for the proceeding direction of an optical signal. Therefore, these constituent elements on the optical signal input side are not shown.

Additionally, in this SOA array optical module 35, an optical signal input side end face 37a and an optical signal output side end face 37b of the SOA array 37, an optical signal input side end face 39a and an optical signal output side end face 39b of the first lens array 39, an optical signal input side end face 41a and an optical signal output side end face 41b of the hermetic window 41, an optical signal input side end face 43a and an optical signal output side end face 43a of the second lens array 43, and an optical signal input side end face 45a of the optical fiber array 45 are arranged in parallel.

Intra-SOA waveguides 36, which respectively configure channels of the SOA array 37, are formed to be inclined by 7 degrees with respect to a normal 46 to the end face of the SOA array 37. Accordingly, the central axis 47 of a beam output from each of the intra-SOA waveguides 36 is oblique by 22.3 degrees to the normal 46 to the end face of the SOA array 37.

In this preferred embodiment, the first and the second lens arrays 39 and 43 are arranged for the SOA array 37 so that the central axis 47 of the beam output obliquely by 22.3 degrees from the SOA array 37, the optical axis of the lens convex part 38 of each channel of the first lens array 39, and the optical axis of the lens convex part 42 of each channel of the second lens array 43 agree with one another.

Namely, level differences are provided almost vertically to the central axes of the output beams of the intra-SOA waveguides 36, which are the channels of the SOA array 37, respectively on the side face opposite to the lens convex parts 38 of the first lens array 39, namely, the optical signal output side end face 39b, which is the rear face of the first lens array 39, and on the side face opposite to the lens convex parts 42 of the second lens array 43, namely, the optical signal input side end face 43a, which is the rear face of the second lens array 43.

As a result, a beam incident along the optical axis of the lens convex part 38 of the first lens array 39 linearly proceeds without being refracted when reaching the rear face of the first lens array 39.

The second lens array 43 is arranged so that its level difference parts, which are formed on the rear face of the second lens array 43 and respectively correspond to the lens convex parts 42, are positioned in the linear direction (refraction in the hermetic window 41 is assumed to be ignored here).

Accordingly, the beam output from the first lens array 39 is incident along the optical axis of the lens convex part 42 unchanged without being refracted when incident to the rear face of the second lens array 43.

Additionally, in this preferred embodiment, a beam spot output from the second lens array 43 along the lens optical axis (that agrees with the central axis 47 of the output beam from the SOA array 37) is refracted at the interface of the optical signal input side end face 45a of the optical fiber array 45, and incident along a central axis 49 of the optical fiber 44, which is arranged to be inclined by 15.2 degrees with respect to a normal 48 to the optical signal input side end face 45a.

The lens optical axis of each channel of the lens array is arranged to agree with the central axis of the output beam of each channel of the SOA array in this preferred embodiment as described above, thereby preventing a coupling loss caused by the aberration of a lens from occurring.

Modification Example of the Second Preferred Embodiment

Figure 8:
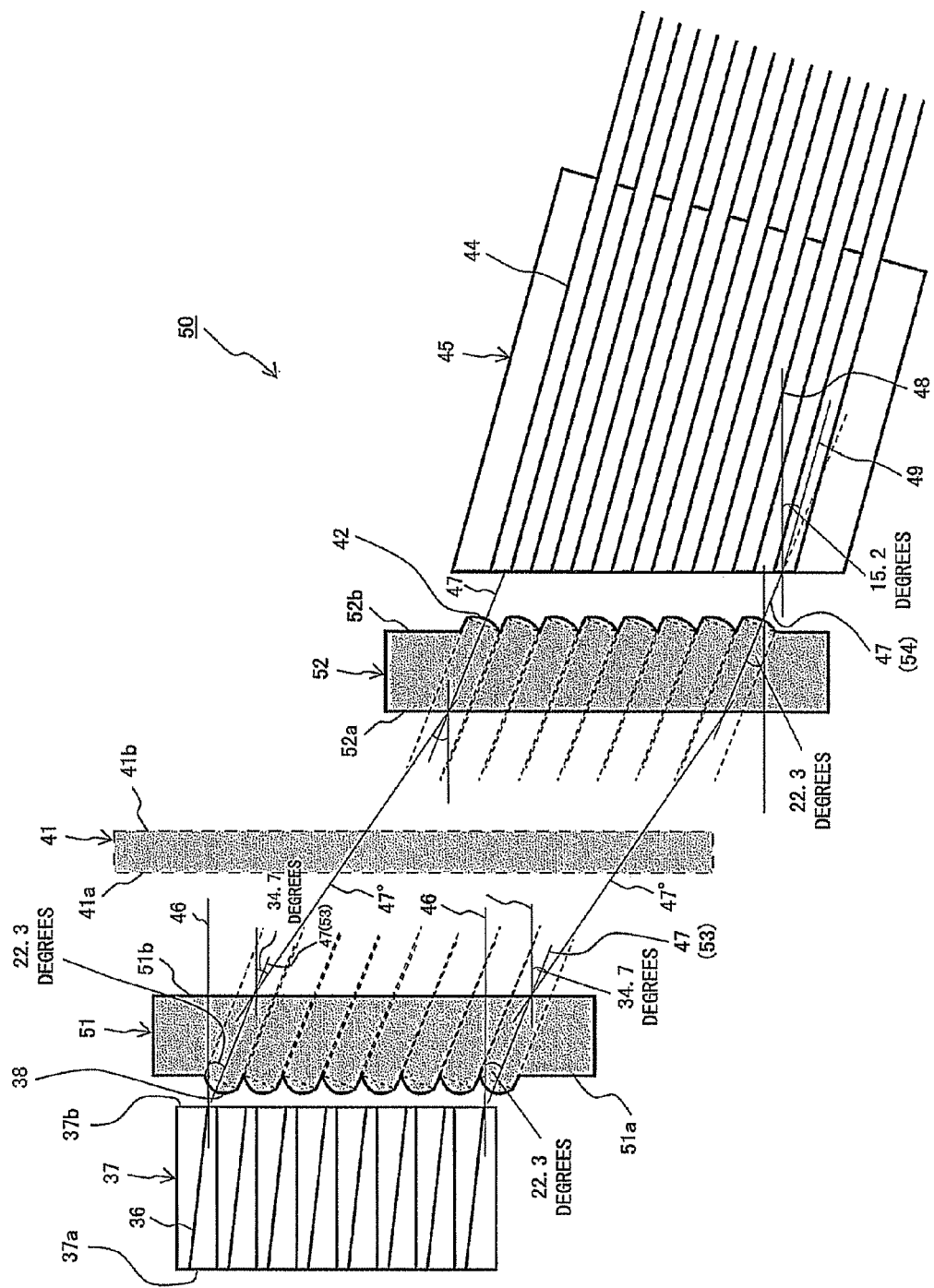
FIG. 8 schematically shows a configuration of a principal portion of an SOA array optical module using lens arrays implemented as a modification example of the second preferred embodiment.

FIG. 8 schematically shows a configuration of a principal portion of an SOA array optical module using lens arrays implemented as a modification example of the second preferred embodiment. In FIG. 8, the same constituent elements as those in FIG. 7 are denoted with the same reference numerals. Additionally, the SOA array optical module 50 in this example is different from that of FIG. 7 only in configurations of first and second lens arrays.

Namely, the SOA array optical module 50 in this example comprises an SOA array 37 of 8 channels, a first lens array 51 of 8 channels, a hermetic window 41 for collectively transmitting optical signals of 8 channels, a second lens array 52 of 8 channels, and an optical fiber array 45 of 8 channels.

Also FIG. 8 shows only the optical signal output side of the SOA array optical module 50. A first lens array, ahermetic window, a second lens array, and an optical fiber array on an optical signal input side are arranged symmetrically with respect to the central point of the SOA array 37, and the principle of optical coupling is the same as that on the optical signal output side except for the proceeding direction of an optical signal. Therefore, the constituent elements on the input side are not shown.

Also in the SOA array optical module 50 in this example, an optical signal input side end face 37*a* and an optical signal output side end face 37*b* of the SOA array 37, an optical signal input side end face 51*a* and an optical signal output side end face 51*b* of the first lens array 51, an optical signal input side end face 41*a* and an optical signal output side end face 41*b* of the hermetic window 41, an optical signal input side end face 52*a* and an optical signal output side end face 52*b* of the second lens array 52, and an optical signal input side end face 45*a* of the optical fiber array 25 are arranged vertically in parallel.

Also in this example, intra-SOA waveguides 36 that respectively configure channels of the SOA array 37 are formed to be inclined by 7 degrees with respect to the normal 46 to the end face of the SOA array 37. Therefore, the central axis 47 of a beam output from each intra-SOA waveguide 36 is inclined downward by 22.3 degrees with respect to a normal 46 to the end face of the SOA array 37.

Since all of the both end faces of the optical signal input/output sides of the arrays are vertically in parallel, the normal 46 to one end face is also a normal to the end faces, which is common to the arrays within the SOA array optical module 50.

In this example, the first lens array 51 is arranged for the SOA array 37 so that the central axis 47 of the beam, which is output obliquely downward by 22.3 degrees from the SOA array 37, and an optical axis 53 of the lens convex part 38 of each channel of the first lens array 51 agree with each other as described above.

Additionally, in this example, the rear face 51*b* of the first lens array 51, and the rear face 52*a* of the second lens array 52 are formed to be planar so that the rear faces and the central axis 47 of the output beam of each channel of the SOA array 37 form the same angle. Namely, there are no level differences.

The rear face 51*b* of the first lens array 51 is planar as describe above, whereby a beam that is output from the SOA array 37 and incident to the first lens array 51 along the optical axis 53 of the lens convex part 38 of the first lens array 51 results in a beam 47' that is refracted downward by 12.4 degrees at the interface of the first lens array 51 when passing through the rear face of the first lens array 51.

Namely, the beam 47 that is output obliquely downward by 22.3 degrees from the SOA array 37 results in the beam 47' that is refracted obliquely downward by a total of 34.7 degrees resulting from 22.3 degrees plus 12.4 degrees when getting out of the rear face of the first lens array 51, passes through the hermetic window 41, and is incident to the rear face 52*a* of the second lens array 52.

When being incident to the rear face 52*a*, the beam 47' is refracted upward by 12.4 degrees at the interface of the second lens array 52. This cancels the above described downward refraction by 12.4 degrees, and the beam 47' again results in a beam that is obliquely downward by 22.3 degrees with respect to the normal 46 (to the optical signal input side end face 52 of the second lens array 52). Then, the beam 47' is incident to the second lens array 52.

This beam is once refracted downward by 12.4 degrees, and displaced downward while proceeding from the first lens array to the second lens array. However, when the downward refraction by 12.4 degrees is canceled as described above and the beam is incident to the second lens array 52, the beam becomes parallel to the central axis of the beam when being output from the SOA array 37.

The second lens array 52 is arranged so that a lens optical axis 54 of the lens convex part 42, which configures each channel of the second lens array 52, agrees with the central axis of incident beam, which is parallel to the central axis of the beam when being output from the SOA array 37.

Accordingly, the beam along the lens optical axis 54 is output to an optical fiber 44 of the optical fiber array 45 from the lens convex part 42 that is arranged on the optical signal output side of the second lens array 52.

Also in this example, a beam spot output from the second lens array 52 along the lens optical axis 54 (parallel to the central axis 47 of the output beam from the SOA array 37) is refracted at the interface of the optical signal input side end face 45*a* of the optical fiber array 45, and incident along the central axis 49 of the optical fiber 44, which is arranged to be inclined by 15.2 degrees with respect to the normal 48 to the optical signal input side end face 45*a*.

As described above, the lens optical axis of each channel of the lens array is arranged to agree with or become parallel to the central axis of the output beam of each channel of the SOA array in this example. Therefore, a coupling loss due to the aberration of a lens does not occur.

FIG. 9 shows a table that represents evaluations of the coupling loss of the above described SOA array optical modules according to the present invention.

In FIG. 9, column cells indicate the "second preferred embodiment using lens arrays and its modification example", the "prototype example using lens arrays" (first preferred embodiment), the "conventional technique 1 using single-channel lenses" (FIG. 1A), and the "conventional technique 2 using spherical lensed fibers" (FIG. 1B), whereas row cells indicate characteristics such as a "configuration", a "coupling loss", and the "degree of easiness of hermetic sealing of module".

For the "coupling loss" and the "degree of easiness of hermetic sealing of module", their evaluation results are represented with ○, x, Δ.

As shown in this figure, the configuration of the "second preferred embodiment using lens arrays and its modification example" is the configuration where light from the SOA array is incident vertically to the lens convex part of the lens array as described in the second preferred embodiment and its modification example.

As a result of examining this configuration, its coupling loss is 3 dB, and its evaluation is "○". Also for the degree of easiness of hermetic sealing of module, its evaluation is "○". This is because the hermetic window can be provided between the first and the second lens arrays, and a normal sealing method is available.

In contrast, the configuration of the "prototype example using lens arrays" is the configuration where light from the SOA array is incident obliquely to the lens convex part of the lens array as described in the first preferred embodiment.

As a result of examining this configuration, its coupling loss is 6 dB, and its evaluation is "x". For the degree of easiness of hermetic sealing of module, however, its evaluation is "○". This is because the hermetic window can be provided between the first and the second lens arrays, and a normal sealing method is available.

Additionally, the configuration of the "conventional technique 1 using single-channel lenses" is the configuration where a single-channel SOA is coupled to a single-channel optical fiber by using a single lens.

The coupling loss of this configuration is 3 dB, and its evaluation is "○". Also for the degree of easiness of hermetic sealing of module, its evaluation is "○". This is because the hermetic window can be provided between the first and the second lens arrays, and a normal sealing method is available.

Furthermore, the configuration of the "conventional technique 2 using spherical lensed fibers" is the configuration where a lens is formed at the tip of an optical fiber.

As a result of examining this configuration, its evaluation is "Δ" due to variations in a plurality of examined channels although its coupling loss is 3 dB.

Still further, this is the configuration where the tip lens part of an optical fiber almost closely contacts the SOA without requiring an independent lens device as in the other embodiments. Therefore, sealing between an optical fiber and the SOA package is difficult, and accordingly, the evaluation of the degree of easiness of hermetic sealing is "x".

Based on the above evaluation results, it can be verified that an SOA array optical module using lens arrays of a plurality of channels, with which a coupling loss is small and hermetic sealing can be made with ease, is only the SOA array optical module using the lens arrays according to the present invention.

Third Preferred Embodiment

Figure 10:
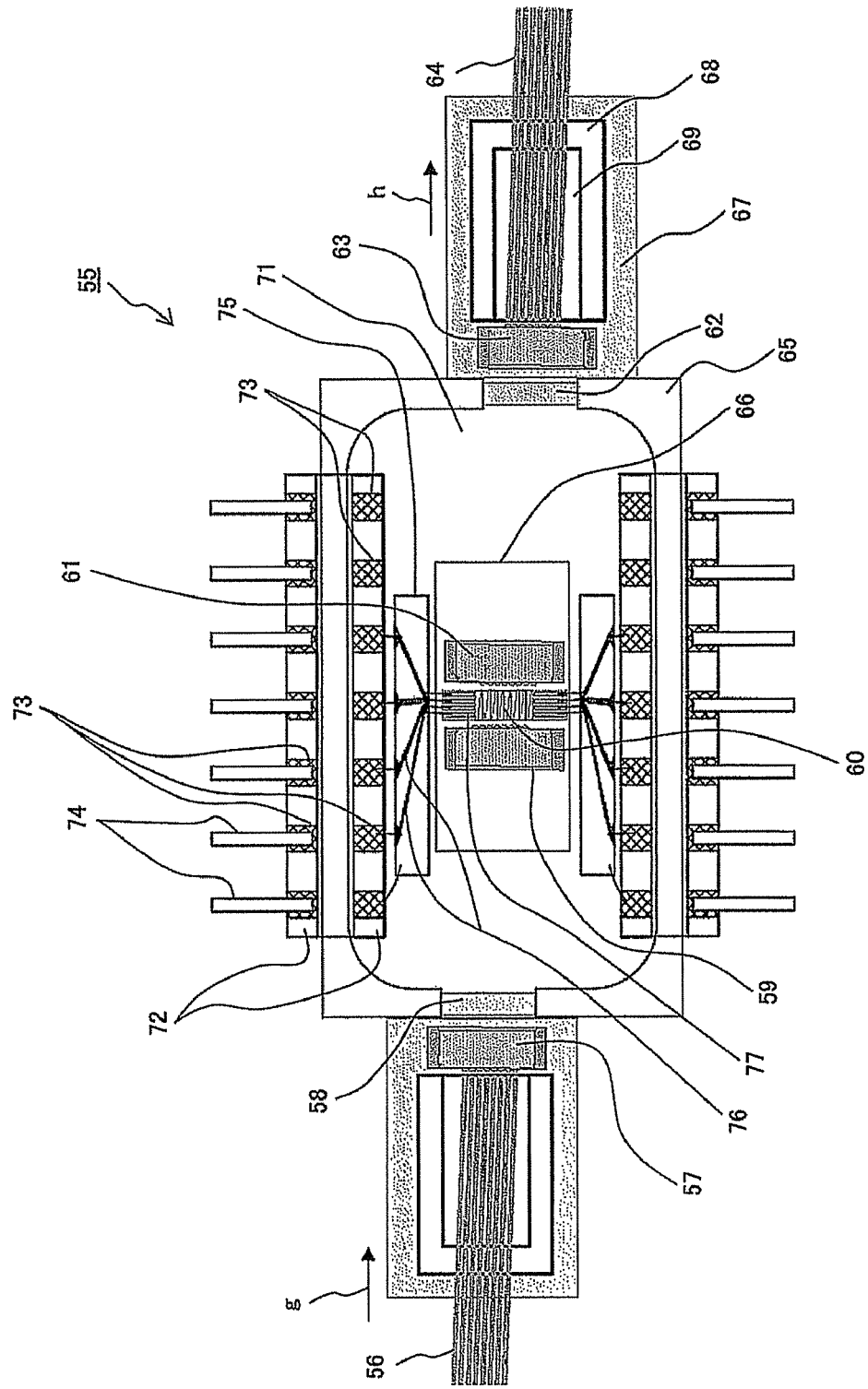
FIG. 10 schematically shows a configuration of an SOA array optical module of 8 channels as a third preferred embodiment.

FIG. 10 schematically shows a configuration of an SOA array optical module of 8 channels as a third preferred embodiment.

In the SOA array optical module 55 shown in FIG. 10, an optical signal input from an optical fiber array 56 is incident to an SOA array 60 via an input side second lens array 57, an input side hermetic window 58, and an input side first lens array 59 as indicated by an arrow g.

The optical signal output from the SOA array 60 is output to an optical fiber array 64 via an output side first lens array 61, an output side hermetic window 62, and an output side second lens array 63 as indicated by an arrow h.

The above described input side hermetic window 58 and the output side hermetic window 62 are made of sapphire glass having, for example, a thickness of 0.4 mm and a diameter of 4 mm, are integrated into one body with a package 65 by being secured with an adhesive, and cooperate with the package 65 to hermetically seal an SOA unit 66 composed of the input side first lens array 59, the SOA array 60, and the output side first lens array 61.

A structure for securing the optical fiber array is the same both on the input and the output sides. Therefore, only the output side is described. As shown in FIG. 10, a welding secured sleeve 67 is closely secured to the package 65 in the proximity of the output side hermetic window 62.

To the welding securing sleeve 67, the output side second lens array 63 is fixed on the side of the output side hermetic window 62 based on the positional relationship with the first lens array, which is shown in FIG. 7 or 8.

Then, the optical fiber array 64 is provided by being aligned with a fiber alignment grooved board 68 and a fiber bracing 69 in positions corresponding to the lens convex parts 42 (see FIG. 7 or 8) of the output side second lens array 63.

Additionally, nitrogen gas is filled in the package 65 that hermetically seals the SOA unit 66. Moreover, ceramic terminals composed of a strip line substrate 72 are installed through the package 65 on one side wall (the upper side wall in FIG. 10) of the package 65.

On the strip line substrate 72, seven strip lines 73 that penetrate through the substrate 72 are provided. Current-driving electrode pins 74 are respectively connected at the outer ends of the strip lines 73.

Within the package 65, a pitch-converting strip line substrate 75 as a fanout terminal for aligning pitches is provided between the strip line substrate 72 and the SOA unit 66 to align pitches. This is because the pitch of an electrode of an SOA carrier 77 and that of the ceramic terminal (the pitch of the strip line 73) of the package 65 are significantly different.

Four pitch-converting strip lines 76 are wired to the pitch-converting strip line substrate 75.

Within the package 65, the leftmost strip line 73 among the seven strip lines 73 of the strip line substrate 72 is connected to the ground of the pitch-converting strip line substrate 75. The next four strip lines 73 are respectively connected to the four pitch-converting strip lines 76 of the pitch-converting strip line substrate 75.

The rightmost two strip lines 73 are connected to a thermal conductive element such as a thermistor, a Peltier element, etc. although this is not shown.

The four terminals, the pitches of which are converted, of the pitch-converting strip lines 76 are respectively connected to the strip line substrate 72 provided within the SOA unit 66.

Ceramic terminals composed of a strip line substrate, the configuration of which is the same as the above described one, are also installed on the opposite side wall (the lower side wall in FIG. 10) of the package 65. Four SOA carriers of the SOA unit 66 on the same side wall as the strip line substrate, and external current-driving electrode pins are connected via pitch-converting strip lines.

With the total of eight current-driving electrode pins 74, an electric signal is applied to each SOA of the SOA array 60 via the strip lines 73, the pitch-converting strip lines 76, and the SOA carriers 77. As a result, each SOA enters an optical amplification state.

In this example, a water content and oxygen are shut off from each SOA of the SOA array 60 by arranging the input side first lens 59 and the output side first lens 61 along with the Peltier element not shown in the neighborhood of the SOA array 60, and by sealing with the hermetic windows 58 and 62.

Outside the package 65, the second lenses 57, 63 and the optical fiber arrays 56, 64 are arranged via the hermetic windows 58 and 62, and the respective components are welded and secured with YAG laser, etc. after being aligned.

What is claimed is:

1. An SOA (Semiconductor Optical Amplifier) array optical module using a lens array for optically coupling an SOA array and an optical fiber array, wherein a lens optical axis of each channel of the lens array is oblique with respect to an input side end face of the lens array, the lens optical axis of each channel is arranged to agree with a central axis of an output beam of each channel of the SOA array, an output optical beam from the SOA array is input obliquely to the lens array, and a plurality of convex parts are formed on the input side end face of the lens array, the convex parts enabling the output optical beam from the SOA array to be input into the lens array without being refracted, a principal axis of the lens is inclined 22.3 degrees from a perpendicular line against the lens array, and the output optical beam from the SOA array matches the principal axis of the lens.

2. The SOA array optical module according to claim 1, wherein a level difference is provided on a rear face of the lens array almost vertically to the central axis of the output beam of each channel of the SOA array.

3. An SOA (Semiconductor Optical Amplifier) array optical module using a lens array for optically coupling an SOA array and an optical fiber array, wherein a lens optical axis of each channel of the lens array is oblique with respect to an input side end face of the lens array, the lens optical axis of each channel of the lens array is arranged to agree with or becomes parallel to the central axis of the output beam of each channel of the SOA array, an output optical beam from the SOA array is input obliquely to the lens array, a plurality of convex parts are formed on the input side end face, and the plurality of convex parts enabling the output optical beam from the SOA array to be input into the lens array without being refracted, a principal axis of the lens is inclined 22.3 degrees from a perpendicular line against the lens array, and the output optical beam from the SOA array matches the principal axis of the lens.

4. The SOA array optical module according to claim 3, wherein:

the lens array is separated into first and second lens arrays;

the first lens array and the second lens array are arranged respectively on a side of the SOA array and a side of the optical fiber array between the SOA array and the optical fiber array a lens optical axis of each channel of the first lens array is arranged to agree with the central axis of the output beam of each channel of the SOA array; and a lens optical axis of each channel of the second lens array is arranged to become parallel to the central axis of the output beam of each channel of the SOA array.

5. The SOA array optical module according to claim 4, wherein rear faces of the first and the second lens arrays are formed to be planar.

6. The SOA array optical module according to claim 3, wherein the lens array is formed by press-molding low-melting glass.

7. The SOA array optical module according to claim 3, wherein the lens array is formed by press-molding plastic.

* * * * *

UNITED STATES PATENT AND TRADEMARK OFFICE
CERTIFICATE OF CORRECTION

PATENT NO. : 7,702,197 B2
APPLICATION NO. : 12/040193
DATED : April 20, 2010
INVENTOR(S) : Goji Nakagawa It is certified that error appears in the above-identified patent and that said Letters Patent is hereby corrected as shown below:

Column 14, Line 9, change "array" to --array;--.

Signed and Sealed this

Sixth Day of July, 2010

David J. Kappos
*Director of the United States Patent and Trademark Office*